United States Patent [19]
Oh et al.

[11] Patent Number: 5,497,105
[45] Date of Patent: Mar. 5, 1996

[54] PROGRAMMABLE OUTPUT PAD WITH CIRCUITRY FOR REDUCING GROUND BOUNCE NOISE AND POWER SUPPLY NOISE AND METHOD THEREFOR

[75] Inventors: Sung-Hun Oh; Richard M. Taylor, both of Phoenix, Ariz.

[73] Assignee: VLSI Technology, Inc., San Jose, Calif.

[21] Appl. No.: 269,800

[22] Filed: Jun. 30, 1994

[51] Int. Cl.⁶ .................................................. H03K 17/16
[52] U.S. Cl. .............................. 326/27; 326/83; 327/268
[58] Field of Search .................................. 326/26–27, 38, 326/83; 327/170, 268, 270, 290, 380, 394

[56] References Cited

U.S. PATENT DOCUMENTS

| | | | |
|---|---|---|---|
| 5,218,239 | 6/1993 | Boomer | 327/394 X |
| 5,220,208 | 6/1993 | Schenck | 326/27 |
| 5,248,906 | 9/1993 | Mahmood | 326/27 |
| 5,315,172 | 5/1994 | Reddy | 327/170 X |
| 5,317,206 | 5/1994 | Hanibuchi et al. | 327/170 X |

Primary Examiner—David R. Hudspeth
Attorney, Agent, or Firm—Harry M. Weiss & Assoc.

[57] ABSTRACT

A programmable output pad is disclosed that reduces ground bounce noise and power supply noise under different power supply values and under different load conditions. The programmable output pad comprises a pre-driver, a driver, and a controllable delay. The pre-driver transfers a signal from the input of the output pad to the driver which, in turn, transfers the signal from the pre-driver to an output of the output pad. The controllable delay provides one or more resistors, transistors, transmission gates, or equivalents thereof at the input of the driver which are controlled in order to provide a plurality of different time delays. By selecting these different time delays, the activation of the driver is delayed by different amounts of time. For a given power supply value and load condition, selection of the proper delay effectively reduces both the ground bounce noise on the ground supply of the programmable output pad and the noise on the power supply of the programmable output pad.

16 Claims, 3 Drawing Sheets

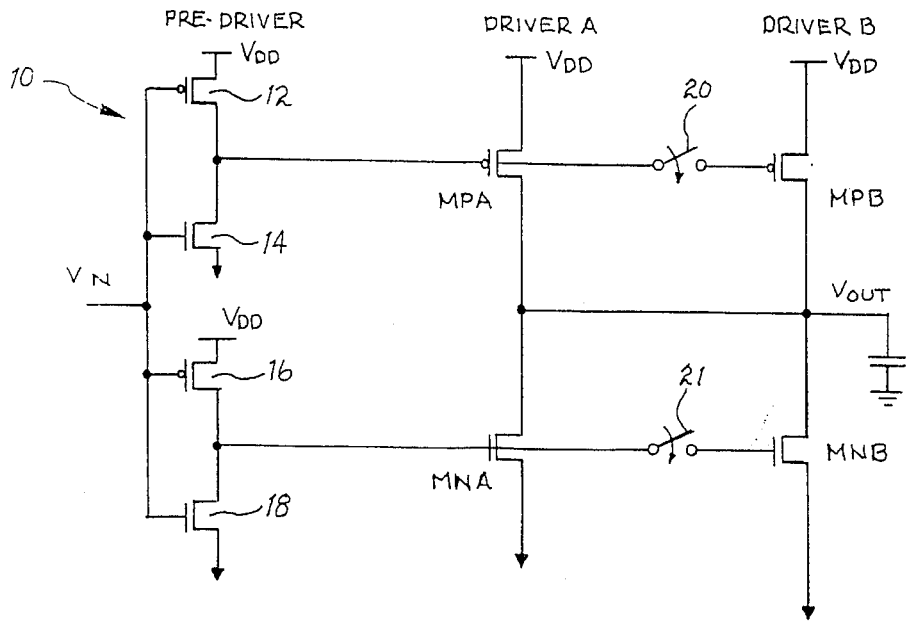
fig. 1 (PRIOR ART)
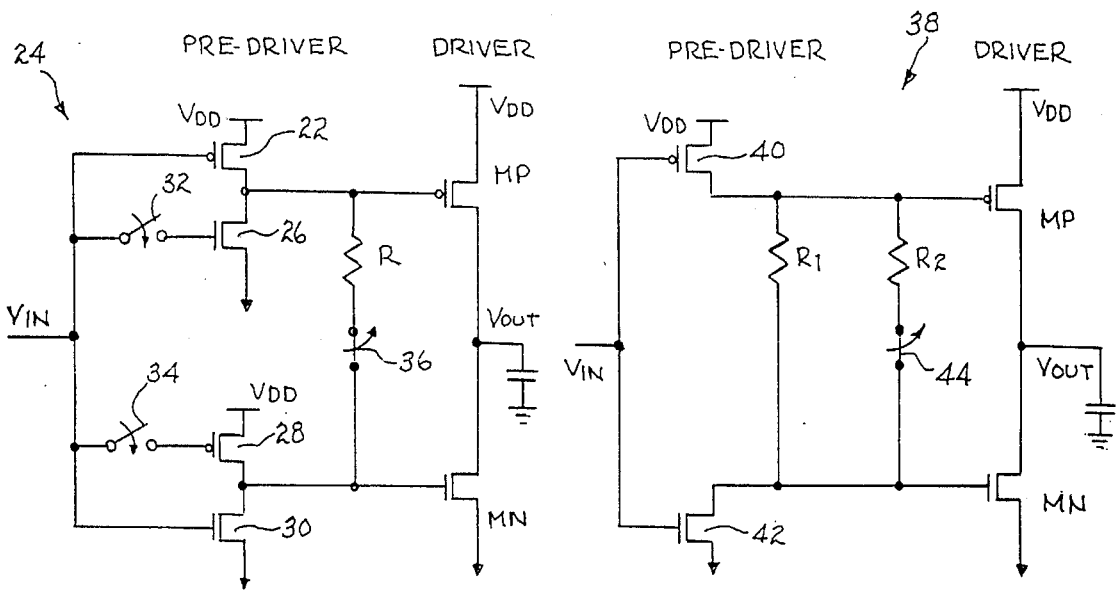
fig. 2
fig. 3

PROGRAMMABLE OUTPUT PAD WITH CIRCUITRY FOR REDUCING GROUND BOUNCE NOISE AND POWER SUPPLY NOISE AND METHOD THEREFOR

BACKGROUND OF THE INVENTION

1. Field of the Invention

This invention relates generally to output pads and, more specifically, to a programmable output pad having circuitry for reducing ground bounce noise and power supply noise and method therefor.

2. Description of the Related Art

In general, computer manufacturers have been designing and producing smaller personal computers such as the laptop computer. This trend of reducing the physical size of computers is largely the result of the success the industry has had in increasing the number of electronic components per unit area on a semiconductor chip. However, the problem of battery power conservation as it relates to the operation of a laptop computer is that a laptop computer operating under battery power typically has only 2–3 hours of operation before the battery must be recharged. There are several possible solutions to the problem of limited battery powered operation for a laptop computer. For example, a laptop computer user can configure the computer in order to extend the battery powered operational time of the laptop by taking such actions as dimming the computer display and reducing the computer's clock speed. Such energy conservation steps make the usage of the laptop computer less enjoyable and less time efficient. Most personal computer users that have shifted from a desktop to a laptop personal computer are reluctant to sacrifice system performance in order to extend the time under which the laptop can operate on battery power.

In an effort to extend the uninhibited operation of the laptop computer while under battery power and in order to make other personal computers such as the desktop personal computer more energy efficient, computer designers are reducing the logic level power supply from the previous industry standard of 5 volts to a new, lower logic level power supply of 3 volts. Currently, most computer systems operate at either 5 or 3 volts. Consequently, it is desirable to design components that can operate effectively at either 5 volts or 3 volts, or some other pair of voltages.

Output pads that are designed to operate effectively at either 5 or 3 volts are subject to the ground bounce noise phenomenon as well as similar types of noise on the 5 or 3 volt power supply. Those skilled in the art may refer to this noise problem on a power supply such as a 5 or 3 volt power supply as voltage droop. Additionally, the ground bounce and power supply noise problems are well known to those skilled in the art. In general, this problem is described as follows. The conductive metal links used for power and ground feeds to components on the output pad posses an inherent amount of inductance. For a single output pad which is powered by these links, when the output pad is switched from one logic level to another, the current flowing through these links is relatively small. However, in a large integrated circuit design, several outputs may change states simultaneously. The combined magnitude of the current variations of these outputs through their power and ground feeds results in the generation of non-trivial induced voltage. This induced voltage is proportional to the time rate of change of the current flowing through the power and ground feeds times the inductance associated therewith. This induced voltage may be applied through the output pad driver's output and may be mistakenly interpreted by a load device as a change in logic, thereby creating erroneous data.

This ground and power supply noise problem becomes more prevalent when an output driver is designed to operate with a 3 volt power supply. For example, if the drive components of an output driver are designed for operation with a 3 volt power supply, but a 5 volt power supply is used, then the increased drive power associated with the 5 volts power supply operation causes the aforementioned ground and power supply noise problem to be more severe at 5 volts than it would have otherwise been at 3 volts. Additionally, if an output driver is designed for driving a relatively heavy load, but a lighter load is actually used, then more ground and power supply noise will result when the load is lighter than the design load. Until now, there has not been an output driver that can be used with different power supply voltages and/or different load conditions while reducing the detrimental effects of the resultant ground and power supply noise which are prevalent when a higher than design power supply is used and/or when a lighter than design load is used.

SUMMARY OF THE INVENTION

In accordance with one embodiment of this invention, it is an object of this invention to provide a programmable output pad having circuitry for reducing ground bounce noise and power supply noise.

It is another object of this invention to provide a method for reducing ground bounce noise and power supply noise in the operation of a programmable output pad.

It is a further object of this invention to provide a programmable output pad that reduces ground bounce noise and power supply noise under different power supply values and under different load conditions.

It is yet another object of this invention to provide a programmable output pad that causes a total delay in transmission of a signal from an input to an output of the programmable output pad to be substantially the same under different power supply voltages and/or under different loads conditions.

BRIEF DESCRIPTION OF THE PREFERRED EMBODIMENTS

In accordance with one embodiment of this invention, a programmable output pad for use with one of a high supply voltage and a low supply voltage is disclosed comprising, in combination, pre-driver means coupled to an input of the programmable output pad for transferring a signal from the input, driver means coupled to the pre-driver means for transferring the signal from the pre-driver means to an output of the programmable output pad, and controllable delay means coupled between the pre-driver means and the driver means for providing a plurality of different time delays for delaying activation of the driver means by different amounts of time and for reducing ground bounce noise on a ground supply of the programmable output pad, and for reducing noise on one of the high supply voltage and the low supply voltage of the programmable output pad. The driver means comprises a first transistor having a control junction thereof coupled to a first portion of the pre-driver means and a second transistor having a control junction thereof coupled to a second portion of the pre-driver means, and the pre-driver means comprises a plurality of transistors. The controllable delay means comprises impedance means coupled between the control junction of the first transistor and the control junction of the second transistor for delaying the activation of the driver means. Also, the controllable delay means further comprises impedance enabling means coupled between the control junction of the first transistor and the control junction of the second transistor for selectively providing a flow path through the impedance means. The impedance means and impedance enabling means may be a resistor and a switch, respectively. Alternatively, the impedance means may be one of a plurality of resistors connected in parallel, a plurality of transistors connected in parallel, and a plurality of transmission gates connected in parallel, and the impedance enabling means configures the impedance means for controlling the slew rate of the signal from the pre-driver means into the driver means. Portions of each of the plurality of resistors, transistors, and transmission gates of the impedance means may also be connected in series, if desired. The impedance enabling means further configures the impedance means for causing a total delay in transmission of the signal from the input to the output of the programmable output pad to be substantially the same when different power supply voltages and/or different load conditions are used. Moreover, the impedance enabling means configures the impedance means for reducing ground bounce noise on the ground supply for different output loads on the programmable output pad, and for reducing noise on one of the high supply voltage and the low supply voltage for different output loads on the programmable output pad. Additionally, the programmable output pad further includes switching means coupled between the input of the programmable output pad and the pre-driver means for configuring the pre-driver means into a first configuration in response to the use of the high supply voltage and for configuring the pre-driver means into a second configuration in response to the use of the low supply voltage. The switching means may be one of a plurality of switches, a plurality of transmission gates, and a plurality of logic gates.

In accordance with another embodiment of this invention, a method of operating a programmable output pad for use with one of a high supply voltage and a low supply voltage is provided comprising the steps of providing pre-driver means coupled to an input of the programmable output pad for transferring a signal from the input, providing driver means coupled to the pre-driver means for transferring the signal from the pre-driver means to an output of the programmable output pad, and providing controllable delay means coupled between the pre-driver means and the driver means for providing a plurality of different time delays for delaying activation of the driver means by different amounts of time and for reducing ground bounce noise on a ground supply of the programmable output pad, and for reducing noise on one of the high supply voltage and the low supply voltage of the programmable output pad.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 1 is a simplified view of an output pad of the prior art.

FIG. 2 is a simplified view of one embodiment of the new programmable output pad.

FIG. 3 is a simplified view of another embodiment of the new programmable output pad.

DESCRIPTION OF THE PREFERRED EMBODIMENTS

Figure 4:
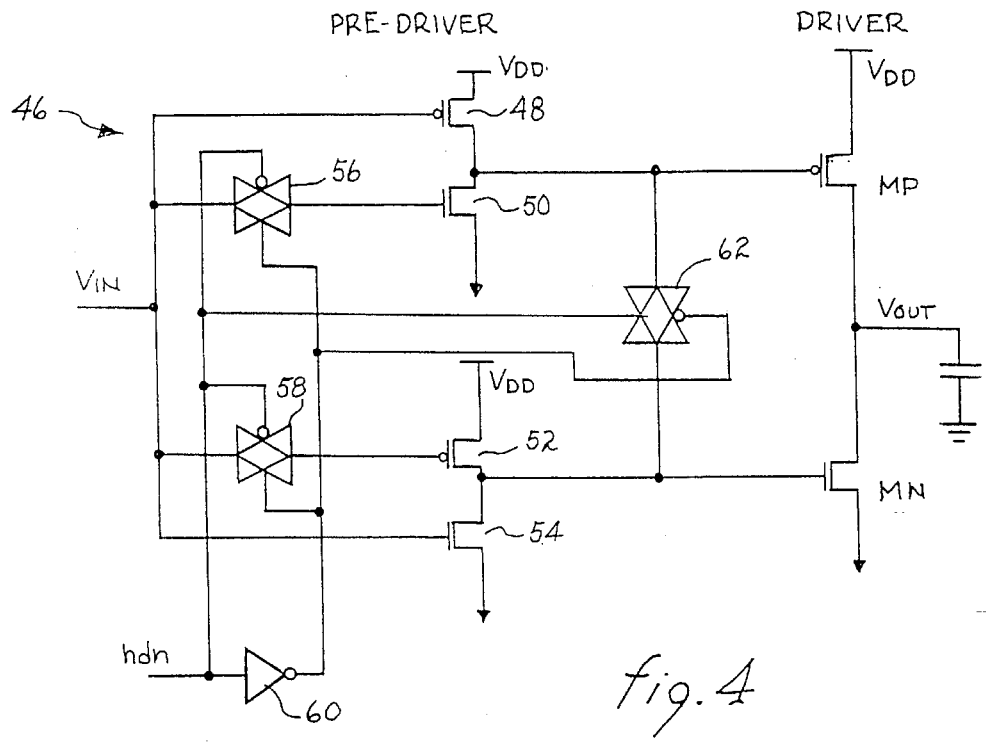
FIG. 4 is a view of a further embodiment of the new programmable output pad.

Referring to FIG. 1, an output pad of the prior art is shown and is generally designated by reference number 10. The output pad 10 includes a pre-driver stage, a driver A stage, and a driver B stage. Each of these stages comprise a series of P-channel MOSFET transistors and N-channel MOSFET transistors, and because it is evident from the Figure which transistors are P type and which are N type, these P-channel MOSFET and N-channel MOSFET transistors will be referred to hereinafter as simply transistor plus a reference number. An input signal Vin is supplied to the gate junction of each of transistors 12, 14, 16, and 18. The source of transistor 12 is connected to a power supply voltage such as 3 or 5 volts. Those skilled in the art recognize that such power supply voltages are frequently referred to as Vdd. Accordingly, each of the figures show such power supply voltages as Vdd. The drain of transistor 12 is connected to the drain of transistor 14, and the source of transistor 14 is connected to a ground supply. Similarly, the source of transistor 16 is connected to a power supply voltage such as 3 or 5 volts, and the drain of transistor 16 is connected to the drain of transistor 18. The source of transistor 18 is connected to a ground supply. The drain junctions of transistors 12 and 14 are connected to the gate junction of the MPA transistor and to one junction of a switch 20. The drain junctions of transistors 16 and 18 are connected to the gate junction of the MNA transistor and to one junction of a switch 21. The source junction of transistor MPA is connected to a power supply and the source junction of transistor MNA is connected to a ground supply. The drain junctions of transistors MPA and MNA are joined together to form an output Vout from the output pad 10. Note that Vout is connected to an output load which is modeled and shown in each of the figures as a capacitor. A second junction of the switch 20 is connected to the gate junction of transistor MPB and a second junction of the switch 21 is connected to the gate junction of transistor MNB. The source junction of transistor MPB is connected to a power supply and the source junction of transistor MNB is connected to a ground supply. The drain junctions of transistors MPB and MNB are joined together to form an output Vout from the output pad 10. Also, note that the drain junctions of transistors MPB and MNB are joined together with the drain junctions of transistors MPA and MNA.

One way of designing the prior art output pad 10 of FIG. 1 is to design it for operation at a high power supply voltage such as 5 volts. When a 5 volt power supply is used, the switches 20 and 21 are controlled to be open, therefore transistors MPB and MNB are off. As a result, the speed with which a signal is transferred through the output pad 10 is a function of the strength of transistors MPA and MNA, and since the transistors MPA and MNA were designed for 5 volt operation, the desired speed characteristic or time delay is met. On the other hand, if a low voltage power supply, such as a 3 volt power supply, were used in lieu of the 5 volt power supply, then the transistors MPA and MNA, by themselves, would not drive the output fast enough due to the lower power supply voltage. Consequently, when a low or 3 volt power supply is used, the switches 20 and 21 are controlled to be shut, therefore transistors MPB and MNB work in concert with transistors MPA and MNA to transfer signals through the output pad 10. In other words, at the lower power supply voltage of 3 volts, a larger driver is needed to drive the output at sufficient speed, and transistors MPB and MNB in combination with transistors MPA and MNA form this larger driver. One drawback of this approach is that transistors MPB and MNB must be relatively large in order to accomplish the desired time delay. Thus, transistors MPB and MNB take up a relatively large area. In addition, the aforementioned ground and power supply noise problem exists for both the 3 volt and the 5 volt power supply scenarios. Consequently, a need existed to create a programmable output pad that reduces ground and power supply noise regardless of power supply voltage level.

Referring to FIG. 2, an embodiment of the new programmable output pad is shown and is generally designated by reference number 24. The output pad 24 includes a pre-driver stage and a driver stage. These stages include a plurality of P-channel MOSFET transistors and N-channel MOSFET transistors. Again, it is evident from the Figure which transistors are P type and which are N type, therefore, these P-channel MOSFET and N-channel MOSFET transistors will be referred to hereinafter as simply transistor plus a reference number or designator. Additionally, the P-channel MOSFET and N-channel MOSFET transistors of FIGS. 3–6 will also be referred to as a transistor plus a reference number or designator, however, please note that other types of transistors could be implemented into the embodiments of the programmable output pad as shown in FIGS. 2–6. An input signal Vin is supplied to the gate junction of each of transistors 22 and 30. The input signal Vin is also supplied to a first junction of switches 32 and 34, and when switches 32 and 34 are closed, the input signal Vin is supplied to the gate junction of each of transistors 26 and 28, respectively. The source of transistor 22 is connected to a power supply voltage such as 3 or 5 volts. The drain of transistor 22 is connected to the drain of transistor 26, and the source of transistor 26 is connected to a ground supply. Similarly, the source of transistor 28 is connected to a power supply voltage such as 3 or 5 volts, and the drain of transistor 28 is connected to the drain of transistor 30. The source of transistor 30 is connected to a ground supply. The drain junctions of transistors 22 and 26 are connected to the gate junction of the MP transistor. The drain junctions of transistors 28 and 30 are connected to the gate junction of the MN transistor. The source junction of transistor MP is connected to a power supply and the source junction of transistor MN is connected to a ground supply. The drain junctions of transistors MP and MN are joined together to form an output Vout from the programmable output pad 24. Also note that a first junction of a resistor R is connected with the gate junction of transistor MP. The second junction of the resistor R may be connected to the gate junction of transistor MN via a switch 36.

The coordinated control of switches 32 and 34 in combination with the control of resistor R and switch 36 reduces the ground and power supply noise problem. The operation thereof will be discussed hereinafter. As previously discussed, the ground and power supply noise problem is a function an induced voltage which is proportional to the time rate of change of the current flowing through the power and ground feeds or supplies times the inductance associated therewith. Since the inductance is a physical property associated with the ground and power supply feeds, this inductance is a non-controllable quantity. The time rate of change of current through these feeds is controllable. For example, suppose a change in logic states causes a current flow to ground through the transistor MN. In other words, the transistor MN is turned on. This is a result of the gate junction of transistor MN reaching the turn on voltage. It is well known in the art that the time rate of change of current flow through the transistor MN, is proportional to the time rate of change of the voltage applied to the gate of transistor MN. Consequently, by slowing the time rate of change of voltage applied to the gate junction of the transistor MN, the time rate of change of current flowing through the transistor to ground is slowed. This is the desired result, and therefore, the induced voltage caused by the time rate of change of current flowing to ground times the inductance is reduced, thereby reducing ground bounce noise. Note that this time rate of change of the voltage applied to the gate junction of transistor MN is also referred to as the slew rate of the voltage applied to the gate junction of transistor MN.

When the switch 36 is closed, the resistor R in combination with the capacitance of the transistor MN forms an RC time constant. By selecting the proper value of resistor R, one can control the slew rate of the applied voltage which charges the gate junction of transistor MN, and therefore, one can control the time rate of change of current flowing to ground through transistor MN, and, in addition, one can control the total time delay of transmission of a signal from the input to the output of the programmable output pad 24.

Referring to FIG. 3, another embodiment of the new programmable output pad is shown and is generally designated by reference number 38. The output pad 38 includes a pre-driver stage and a driver stage. An input signal Vin is supplied to the gate junction of each of transistors 40 and 42. The source of transistor 40 is connected to a power supply voltage such as 3 or 5 volts. The drain of transistor 40 is connected to a first junction of a resistor R1 and a first junction of a resistor R2. Similarly, the source of transistor 42 is connected to a ground supply, and the drain of transistor 42 is connected to the second junction of resistor R1 and to a junction of a switch 44 in series with resistor R2. The drain junction of transistor 40 is also connected to the gate junction of the MP transistor. The drain junction of transistor 42 is also connected to the gate junction of the MN transistor. The source junction of transistor MP is connected to a power supply and the source junction of transistor MN is connected to a ground supply. The drain junctions of transistors MP and MN are joined together to form an output Vout from the programmable output pad 38. The coordinated control of switch 44 in combination with the resistors R1 and R2 reduces the ground and power supply noise problem. The operation thereof will be discussed hereinafter.

Referring to FIG. 4, another embodiment of the new programmable output pad is shown and is generally designated by reference number 46. The output pad 46 includes a pre-driver stage and a driver stage. An input signal Vin is supplied to the gate junction of each of transistors 48 and 54. The input signal Vin is also supplied to a first junction of transmission gates 56 and 58, and when transmission gates 56 and 58 are closed, the input signal Vin is supplied to the gate junction of each of transistors 50 and 52, respectively. Transmission gates are well known in the art. In general, the transmission gates 56 and 58 are each comprised of a P-channel device and an N-channel device. A transmission gate can be modeled as a switch in series with some resistance. When both the P-channel device and the N-channel device of either of the transmission gates 56 and 58 are on, the transmission gate is on. The source of transistor 48 is connected to a power supply voltage such as 3 or 5 volts. The drain of transistor 48 is connected to the drain of transistor 50, and the source of transistor 50 is connected to a ground supply. Similarly, the source of transistor 52 is connected to a power supply voltage such as 3 or 5 volts, and the drain of transistor 52 is connected to the drain of transistor 54. The source of transistor 54 is connected to a ground supply. The drain junctions of transistors 48 and 50 are connected to the gate junction of the MP transistor. The drain junctions of transistors 52 and 54 are connected to the gate junction of the MN transistor. The source junction of transistor MP is connected to a power supply and the source junction of transistor MN is connected to a ground supply. The drain junctions of transistors MP and MN are joined together to form an output Vout from the output pad 46. Also note that another transmission gate 62 is connected at a first junction thereof with the gate junction of transistor MP. A second junction of the transmission gate 62 is connected to the gate junction of transistor MN. Also note that a control signal hdn is applied to each of the transmission gates 56, 58, and 62. The control signal hdn is inverted by inverter 60 to provide another control signal which is input to each of the transmission gates 56, 58, and 62. The coordinated control of the transmission gates 56, 58, and 62 reduces the ground and power supply noise problem. The operation thereof will be discussed below.

Figure 5:
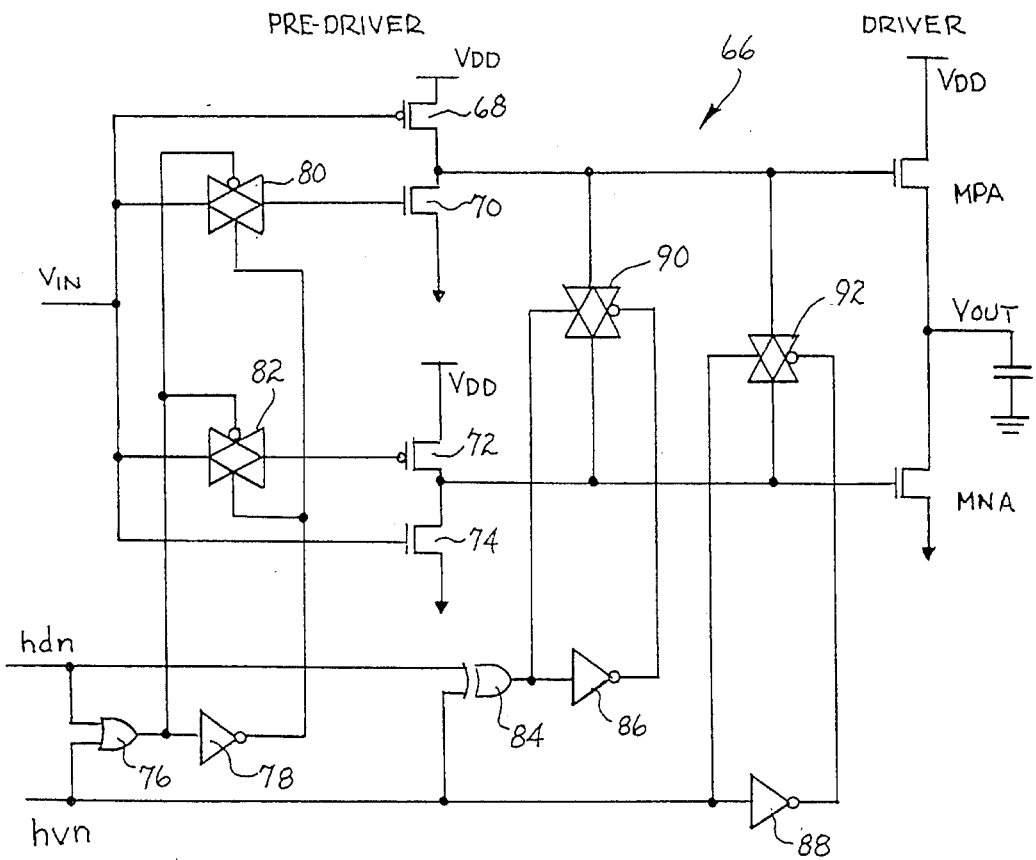
FIG. 5 is a view of another embodiment of the new programmable output pad which can be used under different power supply voltages and different load conditions.

Referring to FIG. 5, yet another embodiment of the new programmable output pad is shown and is generally designated by reference number 66. The programmable output pad 66 includes a pre-driver stage and a driver stage. An input signal Vin is supplied to the gate junction of each of transistors 68 and 74. The input signal Vin is also supplied to a first junction of transmission gates 80 and 82, and when transmission gates 80 and 82 are on, the input signal Vin is supplied to the gate junction of each of transistors 70 and 72, respectively. The source of transistor 68 is connected to a power supply voltage. The drain of transistor 68 is connected to the drain of transistor 70, and the source of transistor 70 is connected to a ground supply. Similarly, the source of transistor 72 is connected to a power supply voltage, and the drain of transistor 72 is connected to the drain of transistor 74. The source of transistor 74 is connected to a ground supply. The drain junctions of transistors 68 and 70 are connected to the gate junction of the MPA transistor. The drain junctions of transistors 72 and 74 are connected to the gate junction of the MNA transistor. The source junction of transistor MPA is connected to a power supply and the source junction of transistor MNA is connected to a ground supply. The drain junctions of transistors MPA and MNA are joined together to form an output Vout from the programmable output pad 66. Also note that two other transmission gates 90 and 92 are connected at a first junction thereof with the gate junction of transistor MPA. Second junctions of the transmission gates 90 and 92 are connected to the gate junction of transistor MNA. Also note that control signals hdn and hvn are modified via the OR gate 76, the XOR (Exclusive OR) gate 84, and the inverters 78, 86 and 88 in order to create control signal for operating each of the transmission gates 80, 82, 90, and 92. The coordinated control of the transmission gates 80, 82, 90, and 92 reduces the ground and power supply noise problem. The operation thereof will be discussed below.

Figure 6:
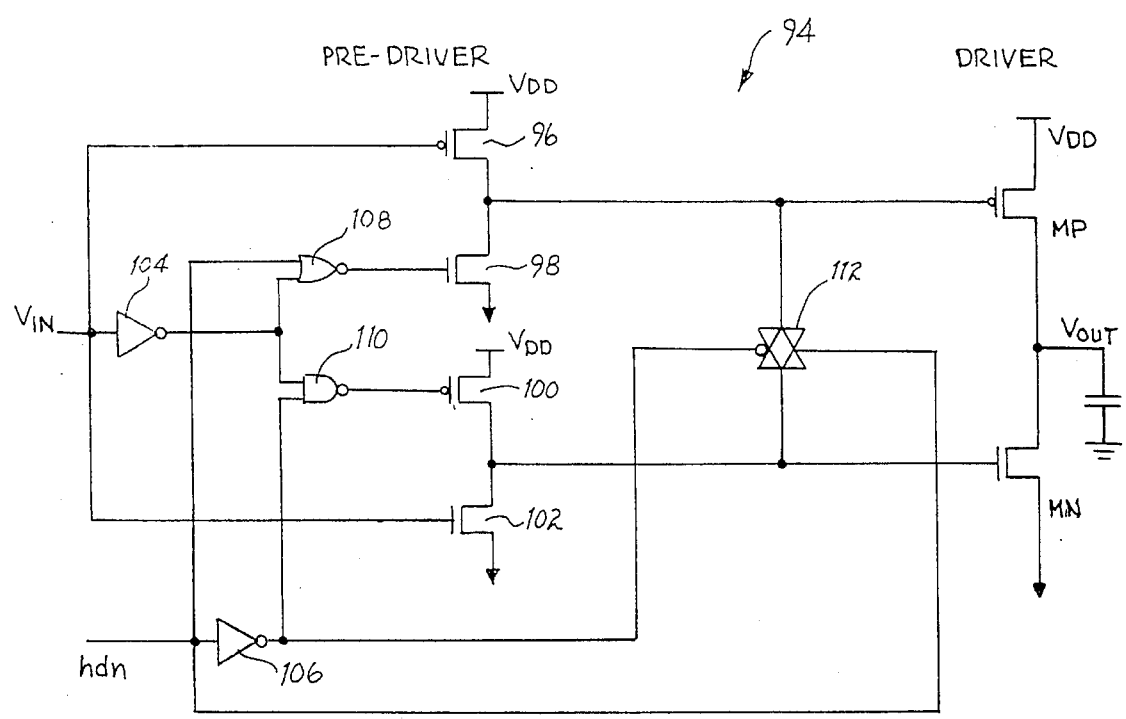
FIG. 6 is a view of yet another embodiment of the new programmable output pad.

Referring to FIG. 6, another embodiment of the new programmable output pad is shown and is generally designated by reference number 94. The output pad 94 includes a pre-driver stage and a driver stage. An input signal Vin is supplied to the gate junction of each of transistors 96 and 102. The input signal Vin is also modified via inverter 104, NOR gate 108, and NAND gate 110 to provide control signals to the gate junction of each of transistors 98 and 100. The source of transistor 96 is connected to a power supply voltage. The drain of transistor 96 is connected to the drain of transistor 98, and the source of transistor 98 is connected to a ground supply. Similarly, the source of transistor 100 is connected to a power supply voltage, and the drain of transistor 100 is connected to the drain of transistor 102. The source of transistor 102 is connected to a ground supply. The drain junctions of transistors 96 and 98 are connected to the gate junction of the MP transistor. The drain junctions of transistors 100 and 102 are connected to the gate junction of the MN transistor. The source junction of transistor MP is connected to a power supply and the source junction of transistor MN is connected to a ground supply. The drain junctions of transistors MP and MN are joined together to form an output Vout from the programmable output pad 94. Also note that a first junction of a transmission gate 112 is connected with the gate junction of transistor MP. A second junction of the transmission gate 112 is connected to the gate junction of transistor MN. A control signal hdn is applied to a gate junction of the transmission gate 112, to an input of NOR gate 108, and to inverter 106 in order to help control the programmable output pad 94. The output of the inverter 106 is applied to another gate junction of the transmission gate 112 and to an input of NAND gate 110 to help control these devices. The operation of this embodiment of the programmable output pad 94 will be discussed hereinafter.

OPERATION

Referring to FIG. 2, the pre-driver and driver stages would be designed to give the desired time delay in transmission of a signal from the input to the output of the programmable output pad 24 at a first power supply voltage such as 3 volts. In the 3 volt power supply case, when the full drive strength of the pre-driver stage is used with the drive stage, the desired total time delay is achieved without excessive ground or power supply noise because at this low power supply voltage, ground and power supply noise is relatively small. Thus, in the 3 volt power supply situation, switches 32 and 34 would be controlled to be shut, and switch 36 would be controlled to be open in order to take advantage of the full drive capability of the programmable output pad 24.

If the power supply voltage were changed to 5 volts and the same configuration of the programmable output pad 24 were implemented, there would be significant ground and power supply noise due to the higher supply voltage driving the programmable output pad 24. In addition, the faster drive rate would result in having a time delay less than the desired time delay. Accordingly, under 5 volt power supply operation, adjustment of the programmable output pad 24 is desired. In particular, so as to avoid turning on the driver stage too quickly, switches 32 and 34 are controlled to be open in order to establish a current path through the resistor R. Moreover, switch 36 is controlled to be shut. As previously discussed, shutting switch 36 creates a flow path through resistor R, which in combination with the capacitance of the transistor MP or MN, establishes an RC time constant. By selecting the appropriate value of resistance for resistor R, one can control and limit the slew rate of the signal input to the gate junction of either transistor MP or MN. Since the time rate of change of the current through either transistor MP or MN is a function of the slew rate of the signal input to the gate junction of either transistor MP or MN, the time rate of change of the current through either transistor MP or MN is reduced, thereby reducing ground or power supply noise. In addition, the proper selection of resistance for resistor R not only reduces ground and power supply noise, but it also helps control the transmission time delay of the signal from input to output of the programmable output pad 24 such that the desired time delay can be achieved at 5 volts as well as at 3 volts. Those skilled in the art will appreciate that this design concept is useful for any pair of power supply voltages. Thus, if in the future the industry moves to even lower power supply voltages, this design concept could be effectively implemented as well.

For the case where a relatively short time delay is not required when a 3 volt power supply voltage is implemented, one could use the programmable output pad 38 of FIG. 3. If a 3 volt power supply voltage were used, then the switch 44 would be controlled to be shut, thereby placing resistors R1 and R2 in parallel in order to have a lower effective resistance than the resistance of resistor R1 alone. The effective resistance of resistors R1 and R2 in parallel with the capacitance of the transistor MP or MN establishes an RC time constant which controls both the slew rate of the input signal to either transistor MP or MN and the overall circuit time delay. Thus, as previously discussed, the proper selection of resistors R1 and R2 helps to control any potential ground and power supply noise as well as the overall circuit time delay.

When a 5 volt power supply is used with the programmable output pad 38, switch 44 is controlled to be open, thereby placing resistor R1 across the inputs to transistors MP and MN. Of course, the resistance of resistor R1 alone is greater than the effective resistance of resistor R1 in parallel with resistor R2. Thus, a larger RC time constant both reduces the slew rate of the input signal to either of the transistors MP or MN and increases the time delay in order to establish the desired time delay.

The programmable output pad 46 of FIG. 4 is largely similar to the programmable output pad 24 of FIG. 2. The primary difference is that programmable output pad 46 uses transmission gates 56, 58, and 62 in lieu of the switches 32, 34, and 36 used by programmable output pad 24 of FIG. 2. Accordingly, the operation of the programmable output pad 46 with respect to the 3 and 5 volt power supply cases is analogous to the previously discussed operation of the programmable output pad 24. One will note that a control signal hdn is provided to an input of each of the transmission gates 56 and 58 as well as to an input of the inverter 60. The output of the inverter 60 is also supplied as an input to each gate of the transmission gates 56, 58, and 62. Remembering that the transmission gates 56, 58, and 62 can be modeled as switches in series with some resistance, one skilled in the art knows that when the control signal hdn is low, the transmission gates 56 and 58 establish a flow path to the gate junctions of transistors 50 and 52, respectively, and the transmission gate 62 is off. Conversely, if the control signal hdn is high, the transmission gates 56 and 58 deny a flow path to the gate junctions of transistors 50 and 52, respectively, and the transmission gate 62 is on. Please note that the control circuitry for the switches 32, 34, 36, and 44 in FIGS. 2 and 3 is not shown for simplification of the drawings, however, such control circuitry could be implemented in several different ways which would be well known to those skilled in the art.

Not only could the programmable output pad 46 be used with both the 3 and 5 volt power supplies while reducing ground and power supply noise, but the programmable output pad 46, as well as the programmable output pad 24, could also be used under varying load conditions to reduce ground and power supply noise. As previously explained, ground and power supply noise can be caused by operating an output pad with a power supply voltage above the design power supply voltage. Additionally, it has also been previously disclosed that operating an output pad to drive an output load below the design output load can result in elevated ground and power supply noise due to the output pad driving capability exceeding the output load. Those skilled in the art will appreciate that the programmable output pad 46 can be implemented to reduce ground and power supply noise whether it be caused by power supply mismatch or load mismatch. For example, if a lighter than design load were being driven by the programmable output pad 46 or if a higher than design power supply voltage were used, then the control signal hdn would be high. As a result, the transmission gates 56 and 58 would effectively isolate the gate junctions of transistors 50 and 52 from Vin. In addition, transmission gate 62 would be turned on, and those skilled in the art realize that the transmission gate 62 could then be modeled as a closed switch in series with a resistor. Thus, by selecting the proper sized transmission gate 62, an appropriate RC time constant is established to reduce the slew rate of the input signal to either transistor MP or MN, thereby reducing ground or power supply noise.

The general principal of selectively controlling pre-driver input switches and establishing an appropriate RC time constant at the input of the driver stage applies to the programmable output pad 66 of FIG. 5 as it applied to the previously discussed embodiments of the programmable output pad. However, the control circuitry of the programmable output pad 66 is markedly different in that it can control transmission gates 80, 82, 90, and 92 in response to a combination of different power supply and load conditions. In particular, control signals hvn and hdn are high when the power supply voltage is higher than the design power supply voltage and when the load is lower than the design load, respectively.

For example, if the power supply was low and the load was high, then both control signals hvn and hdn are low. As a result, the output of OR gate 76 is low and the output of inverter 78 is high. Thus, transmission gates 80 and 82 are on to establish a flow path to the gate junctions of the transistors 70 and 72, respectively. Additionally, the output of the XOR gate 84 would be low and the outputs of the inverters 86 and 88 would be high, thereby turning off transmission gates 90 and 92. This configuration of the programmable output pad 66 permits maximum drive despite the lower power supply voltage and the relatively heavy load.

As another example, assume that the power supply and load were low. In this case, although the power supply being low tends to lower the drive strength of the programmable output pad 66, the low load does not require high drive strength, and therefore, the potential for ground and power supply noise exists. Thus, in order to reduce the potential for the occurrence of ground and power supply noise, it is desirable to reduce the slew rate of the signal into the transistors MPA and MNA. Accordingly, the control signals hvn and hdn would be low and high, respectively. As a result, the transmission gates 80, 82, and 92 would be off while transmission gate 90 would be on in order to reduce the slew rate of the signal into the transistors MPA and MNA, thereby reducing any potential ground and power supply noise.

As yet another example, assume that the power supply was high and the load was relatively high. In this case, although the power supply being high tends to increase the drive strength of the programmable output pad 66, the heavy load requires high drive strength. In order to reduce the potential for ground and power supply noise, it is desirable to reduce the slew rate of the signal into the transistors MPA and MNA. Accordingly, the control signals hvn and hdn would be high and low, respectively. As a result, the transmission gates 80 and 82 would be off while transmission gates 90 and 92 would be on in order to reduce the slew rate of the signal into the transistors MPA and MNA, thereby reducing any potential ground and power supply noise.

As a further example, assume that the power supply was high and the load was low. In this case, the power supply being high tends to increase the drive strength of the programmable output pad 66 and the light load requires low drive strength. In this case, it is apparent that the potential for ground and power supply noise is great, and therefore, it is desirable to reduce the slew rate of the signal into the transistors MPA and MNA by a substantial amount. Accordingly, the control signals hvn and hdn would both be high. As a result, the transmission gates 80, 82, and 90 would be off while transmission gate 92 would be on in order to reduce the slew rate of the signal into the transistors MPA and MNA, thereby reducing any potential ground and power supply noise. Note that the proper size of transmission gates 90 and 92 would create the desired resistance values and RC time constants for reducing the slew rate by the appropriate amount for each of the four cases mentioned above.

The programmable output pad 94 of FIG. 6 can be used under either a power supply mismatch or load mismatch. Suppose, for example, that the programmable output pad 94 was designed for operation with a 3 volt power supply, however, a higher 5 volt power supply was being used. In this case, the hdn signal would be high, and therefore, the outputs of the NOR gate 108 and the NAND gate 110 would be low and high, respectively. Accordingly, the transistors 98 and 100 would be turned off, and the transmission gate 112 would be turned on. Those skilled in the art recognize that the transmission gate 112 could be modeled as a resistor in series with a switch. Consequently, the effective resistance of the transmission gate 112 in combination with the capacitance of the transistors MP or MN forms an RC time constant, and therefore, the slew rate of the signal input to the transistors MP or MN is reduced in order to reduce ground and power supply noise. Conversely, when the control signal hdn is low, indicating that the proper power supply voltage is in use, then the inverters 104 and 106 in combination with the NOR gate 108 and the NAND gate 110 operate to turn on transistors 98 and 100 while turning off transmission gate 112.

In summary, it has been shown that ground and power supply noise may result either from using a higher power supply voltage than the power supply voltage for which the programmable output pad was designed or from operating the programmable output pad to drive an output load which is lower than the design output load. Each of the programmable output pads 24, 38, 46, 66, and 94 can be used in either scenario. Additionally, programmable output pad 66 is specifically designed to reduce ground and power supply noise where there may be a combination of power and/or load mismatch. It has been shown that inserting and then controlling one or more impedance sources of the proper value across the input gate junctions of the output driver stage, one can select one of a plurality of different RC time constants in order to control the slew rate of the signal input to the output driver stage, thereby effectively reducing ground and power supply noise. Additionally, it has been shown that selecting the proper value of impedance for these impedance or resistance sources, one can properly control the total time delay of transmitting a signal through the programmable output driver.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A programmable output pad for use with one of a high supply voltage and a low supply voltage, comprising, in combination:

pre-driver means coupled to an input of said programmable output pad for transferring a signal from said input, said pre-driver means comprising a plurality of transistors;

driver means coupled to said pre-driver means for transferring said signal from said pre-driver means to an output of said programmable output pad, said driver means comprising:
   a first transistor having a control junction thereof coupled to a first portion of said pre-driver means, and
   a second transistor having a control junction thereof coupled to a second portion of said pre-driver means; and controllable delay means coupled between said pre-driver means and said driver means for providing a plurality of different time delays for delaying activation of said driver means by different amounts of time and for reducing ground bounce noise on a ground supply of said programmable output pad, and for reducing noise on one of said high supply voltage and said low supply voltage of said programmable output pad, said controllable delay means comprising impedance means coupled between said control junction of said first transistor and said control junction of said second transistor for delaying said activation of said driver means.

2. The programmable output pad of claim 1 wherein said controllable delay means further comprises impedance enabling means coupled between said control junction of said first transistor and said control junction of said second transistor for selectively providing a flow path through said impedance means.

3. The programmable output pad of claim 2 wherein said impedance means and impedance enabling means are a resistor and a switch, respectively.

4. The programmable output pad of claim 2 wherein said impedance means is one of a plurality of resistors connected in parallel, a plurality of transistors connected in parallel, and a plurality of transmission gates connected in parallel, and said impedance enabling means configures said impedance means for controlling the slew rate of said signal from said pre-driver means into said driver means.

5. The programmable output pad of claim 2 wherein said impedance enabling means configures said impedance means for causing a total delay in transmission of said signal from said input to said output of said programmable output pad to be substantially the same when said high supply voltage is used as when said low supply voltage is used.

6. The programmable output pad of claim 2 wherein said impedance enabling means configures said impedance means for reducing ground bounce noise on said ground supply for different output loads on said programmable output pad, and for reducing noise on one of said high supply voltage and said low supply voltage for different output loads on said programmable output pad.

7. The programmable output pad of claim 2 further including switching means coupled between said input of said programmable output pad and said pre-driver means for configuring said pre-driver means into a first configuration in response to said use of said high supply voltage and for configuring said pre-driver means into a second configuration in response to said use of said low supply voltage.

8. The programmable output pad of claim 7 wherein said switching means are one of a plurality of switches, a plurality of transmission gates, and a plurality of logic gates.

9. A method of operating a programmable output pad for use with one of a high supply voltage and a low supply voltage comprising the steps of:

providing pre-driver means coupled to an input of said programmable output pad for transferring a signal from said input, said pre-driver means comprising a plurality of transistors;

providing driver means coupled to said pre-driver means for transferring said signal from said pre-driver means to an output of said programmable output pad, said driver means comprising:
 a first transistor having a control junction thereof coupled to a first portion of said pre-driver means, and
 a second transistor having a control junction thereof coupled to a second portion of said pre-driver means; and providing controllable delay means coupled between said pre-driver means and said driver means for providing a plurality of different time delays for delaying activation of said driver means by different amounts of time and for reducing ground bounce noise on a ground supply of said programmable output pad, and for reducing noise on one of said high supply voltage and said low supply voltage of said programmable output pad, said controllable delay means comprising impedance means coupled between said control junction of said first transistor and said control junction of said second transistor for delaying said activation of said driver means.

10. The method of claim 9 wherein said controllable delay means further comprises impedance enabling means coupled between said control junction of said first transistor and said control junction of said second transistor for selectively providing a flow path through said impedance means.

11. The method of claim 10 wherein said impedance means and impedance enabling means are a resistor and a switch, respectively.

12. The method of claim 10 wherein said impedance means is one of a plurality of resistors connected in parallel, a plurality of transistors connected in parallel, and a plurality of transmission gates connected in parallel, and said impedance enabling means configures said impedance means for controlling the slew rate of said signal from said pre-driver means into said driver means.

13. The method of claim 10 wherein said impedance enabling means configures said impedance means for causing a total delay in transmission of said signal from said input to said output of said programmable output pad to be substantially the same when said high supply voltage is used as when said low supply voltage is used.

14. The method of claim 10 wherein said impedance enabling means configures said impedance means for reducing ground bounce noise on said ground supply for different output loads on said programmable output pad, and for reducing noise on one of said high supply voltage and said low supply voltage for different output loads on said programmable output pad.

15. The method of claim 10 further including switching means coupled between said input of said programmable output pad and said pre-driver means for configuring said pre-driver means into a first configuration in response to said use of said high supply voltage and for configuring said pre-driver means into a second configuration in response to said use of said low supply voltage.

16. The method of claim 15 wherein said switching means are one of a plurality of switches, a plurality of transmission gates, and a plurality of logic gates.

* * * * *